United States Patent

Liu et al.

[11] Patent Number: 6,150,273
[45] Date of Patent: Nov. 21, 2000

[54] METHOD OF FABRICATING A KINK-EFFECT-FREE SHALLOW TRENCH ISOLATIONS

[75] Inventors: Lu-Min Liu, Hsinchu; Hsi-Chieh Chen, Taipei; Ping-Ho Lo, Hsinchu; Sheng-Hao Lin, Keelung, all of Taiwan

[73] Assignee: United Microelectronics Inc., Taiwan

[21] Appl. No.: 09/200,628

[22] Filed: Nov. 30, 1998

[30] Foreign Application Priority Data

Aug. 28, 1998 [TW] Taiwan ................................ 87114240

[51] Int. Cl.⁷ .................................................. H01L 21/302
[52] U.S. Cl. ......................... 438/692; 438/694; 438/696; 438/697; 438/719
[58] Field of Search ...................... 438/696, 427, 438/692, 697, 710, 764, 770, 787, 724, 719, 722, 694

[56] References Cited

U.S. PATENT DOCUMENTS

| | | | |
|---|---|---|---|
| 4,307,180 | 12/1981 | Pogge ................................ | 438/424 |
| 4,740,480 | 4/1988 | Ooka ................................. | 438/436 |
| 5,433,794 | 7/1995 | Fazan et al. ...................... | 148/33.3 |
| 5,436,190 | 7/1995 | Yang et al. ....................... | 438/296 |
| 5,521,422 | 5/1996 | Mandelman et al. ............. | 257/510 |
| 5,536,675 | 7/1996 | Bohr ................................. | 438/427 |
| 5,614,430 | 3/1997 | Liang et al. ..................... | 438/291 |
| 5,683,932 | 11/1997 | Bashir et al. .................... | 438/427 |

*Primary Examiner*—Benjamin L. Utech
*Assistant Examiner*—Binh X. Tran

[57] ABSTRACT

A method of fabricating kink-effect-free shallow trench isolations is presented in this invention. First, a layer of silicon oxide and a layer of polysilican are sequentially deposited on a substrate, and then shallow trenches are formed, next thermal oxidation is performed to grow a passivation oxide layer on the exposed silicon, and then, a dielectric layer is formed to fill into the shallow trench. Finally, the dielectric layer on the active area is removed by using chemical mechanical polishing and the polysilicon layer provides for the etching end point. The level of shallow trench is higher than the level of active area as soon as stop polishing, because the polysilicon layer is polished faster than dielectric layer. It provides the passivation oxide on the sidewall of shallow trench to form spacers of the active area after removing the polysilicon of active area. It can provide a perfect shallow trench after an oxidation and etching process to avoid the kink effect.

13 Claims, 5 Drawing Sheets

6,150,273

METHOD OF FABRICATING A KINK-EFFECT-FREE SHALLOW TRENCH ISOLATIONS

BACKGROUND OF THE INVENTION (1) Field of the Invention

The present invention relates to a method of fabricating kink-effect-free shallow trench isolations.

(2) Description of the Related Art

In recent years, the distance of the individual transistor had continuously decreased so that the integrated circuit density on chips formed from semiconductor has dramatically increased. In the LOCOS approach, the oxide is selectively grown over the field regions of the ICs. This is done by covering the active regions with a thin layer of silicon nitride. When the field oxide is grown, the active regions remain covered by nitride, which prevents oxidation of the silicon beneath. The oxide grows on the silicon substrate surface where there is no masking nitride. However, at the edges of the nitride, some oxidant diffuses laterally to cause the oxide to grow under and lift the nitride edges that is so called bird's beak effect. The bird's beak will cause serious isolation problems for subsequent processes in the active regions, especially for the submicron and the deep submicron technology. In addition, an implant is performed in the field regions to create a channel-stop doping layer under the field oxide. During field oxidation, the channel-stop boron experiences both segregation and oxidation-enhanced diffusion. Therefore, relatively high boron doses are needed in order for acceptable field threshold voltages to be achieved. This also implies that the peak of the boron implant must be deep enough that it is not absorbed by the growing field-oxide interface. If the channel-stop doping is too heavy, it will cause a high source/drain-to-substrate capacitance and reduce source/drain-to-substrate pn junction breakdown voltage. In order for the application of submicron and deep submicron processes, a new isolation method is desired to replace current LOCOS.

The most probable successor to LOCOS in CMOS is the shallow trench isolation. A typical structure would be formed in the following manner: referring now more particularly to FIGS. 1A, an oxide layer 13 and a nitride layer 15 are sequentially formed on a silicon substrate 11 surface. The oxide layer 13 and a nitride layer 15 are then patterned by the conventional photolithography and the plasma etching technique defines the shallow trench regions 12, which vary significantly in widths at different locations across the surface of the substrate and separate active regions. As a result the surface of the dielectric layer scratches easily when etching the rigid nitride layer 15 and the dielectric layer 17 at the same time by using chemical mechanical polishing (CMP). The scratches form recesses 19, when the active areas 14 and shallow trenches 12 are removed isotropic etching as shown in FIGS. 1B. Furthermore, more serious Oxide-Recesses 19a are formed by the oxidation and etching of the recesses 19 at the sidewall of shallow trenches 12 as shown the dash lines in FIGS. 1B.

SUMMARY OF THE INVENTION

Accordingly, it is the primary object of the present invention to provide a method of fabricating kink-effect-free shallow trench isolations for avoiding scratches on the surface of a dielectric layer from the etchback process of shallow trench isolations by using a polysilicon layer as a stop etching layer.

It is another object of the present invention to provide a method of fabricating kink-effect-free shallow trench isolations for avoiding kink-effect-free by replacing a silicon nitride layer with a polysilicon layer.

In accordance with the object of this invention, there is provided a method of fabricating kink-effect-free shallow trench isolations. First, an oxide layer and a polysilicon layer are formed sequentially on a substrate. Then, a plurality of shallow trenches is formed by etching through the oxide layer and polysilicon layer inside the substrate, wherein the shallow trench comprises wide shallow trench regions and narrow shallow trench regions. Next, a passivation oxide layer is formed on the substrate by using a method of thermal oxidation, and a dielectric layer is deposited to fill into the shallow trenches. Next, the polysilicon is used to be a stop etching layer for removing the dielectric layer from the active areas in a CMP process. The surface of the shallow trench regions will be higher than the surface of the active areas after the polysilicon polishing process. Finally, the sidewall spacers are formed by using the residual passivation oxide which is on the sidewall of the shallow trenches when removing the polysilicon. The sidewall spacers can protect the shallow trenches to avoid the kink effect during the follow-up process of oxidation and etching.

BRIEF DESCRIPTION OF THE DRAWINGS

The accompanying drawings forms a material part of this description, in which.

DESCRIPTION OF THE PREFERRED EMBODIMENTS

Figure 1:
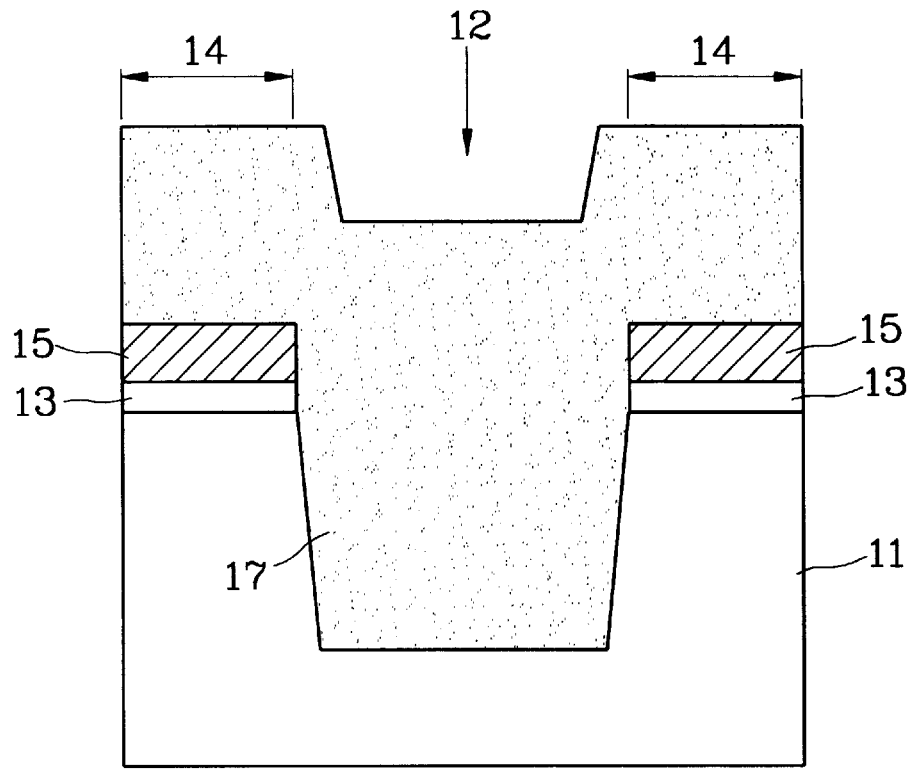
FIGS. 1a and 1b are cross sectional views showing the scratch in the edges between the active areas and the shallow trenches of a conventional shallow trench process.
Figure 1:
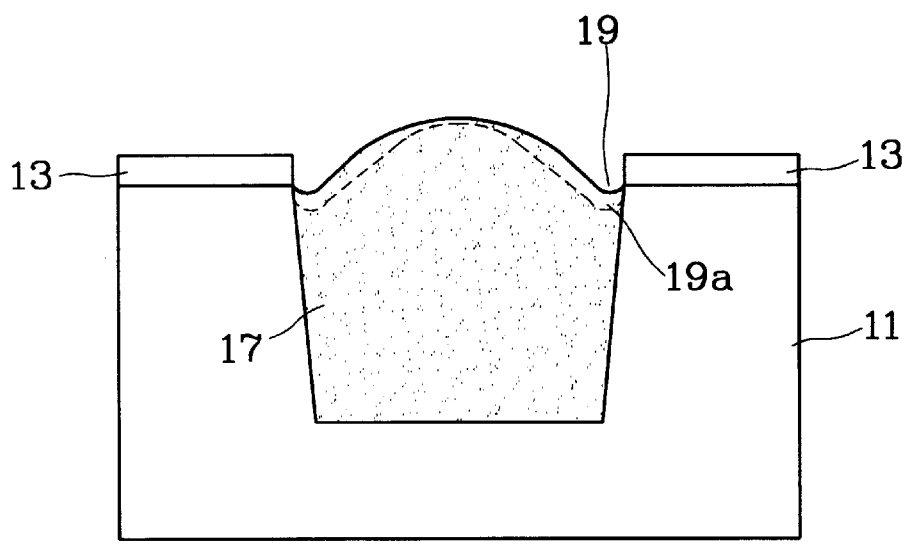
Figure 2:
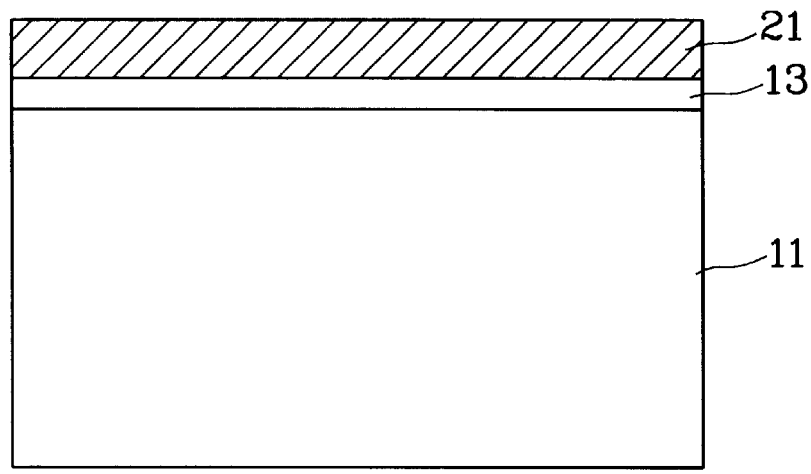
FIGS. 2a to 2g are cross sectional views showing improved a kink-effect-free shallow trench isolation process according to the embodiment of the present invention.
Figure 2:
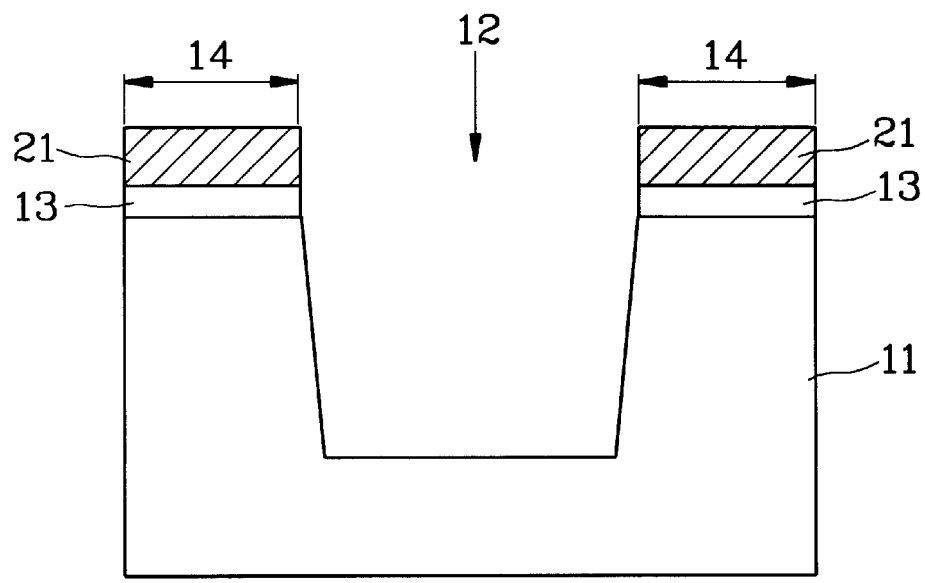
Figure 2:
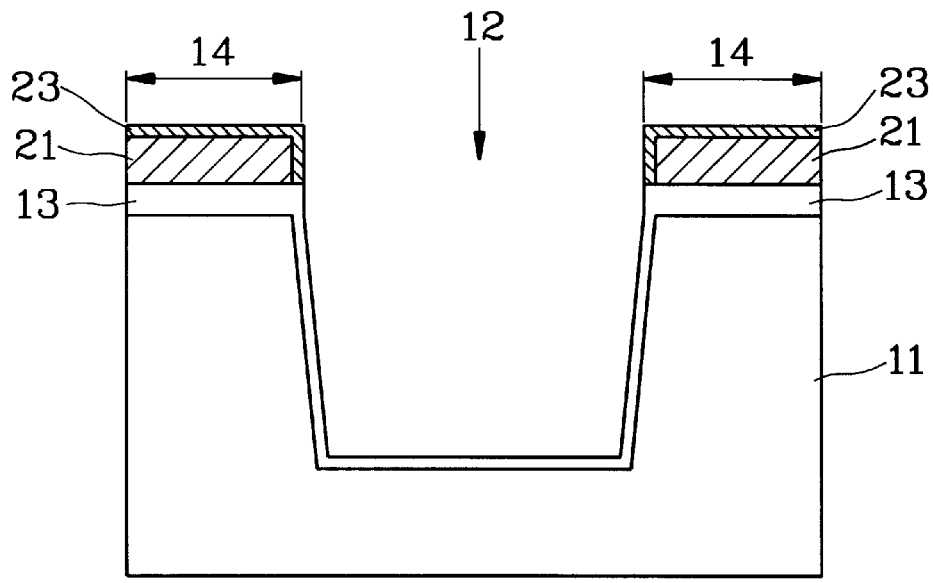
Figure 2:
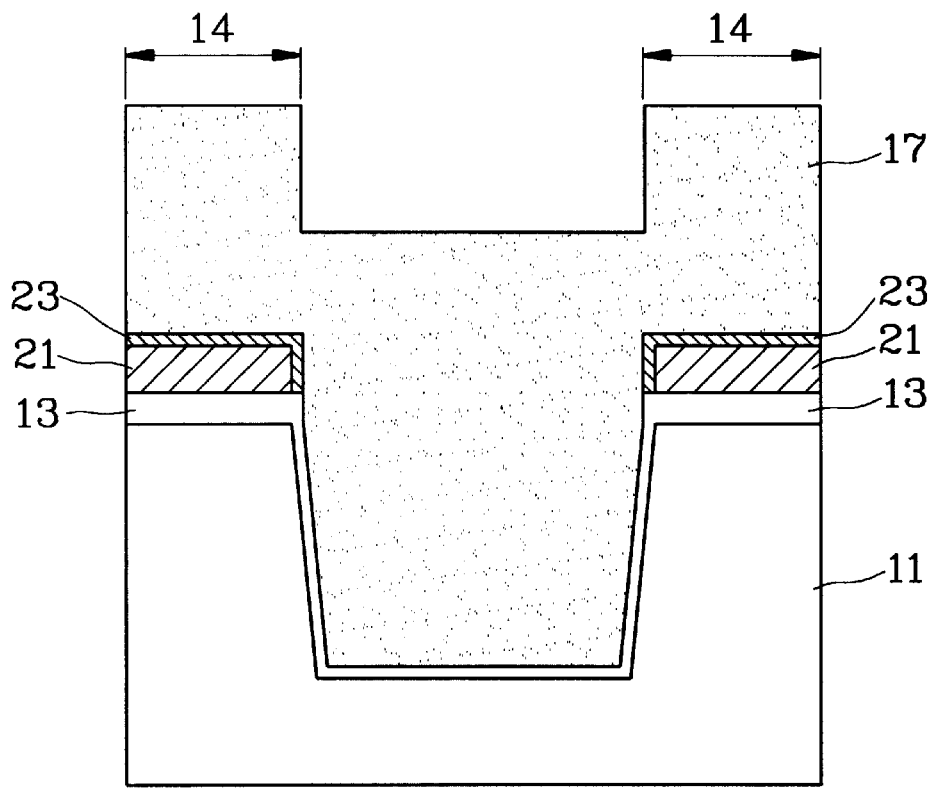
Figure 2:
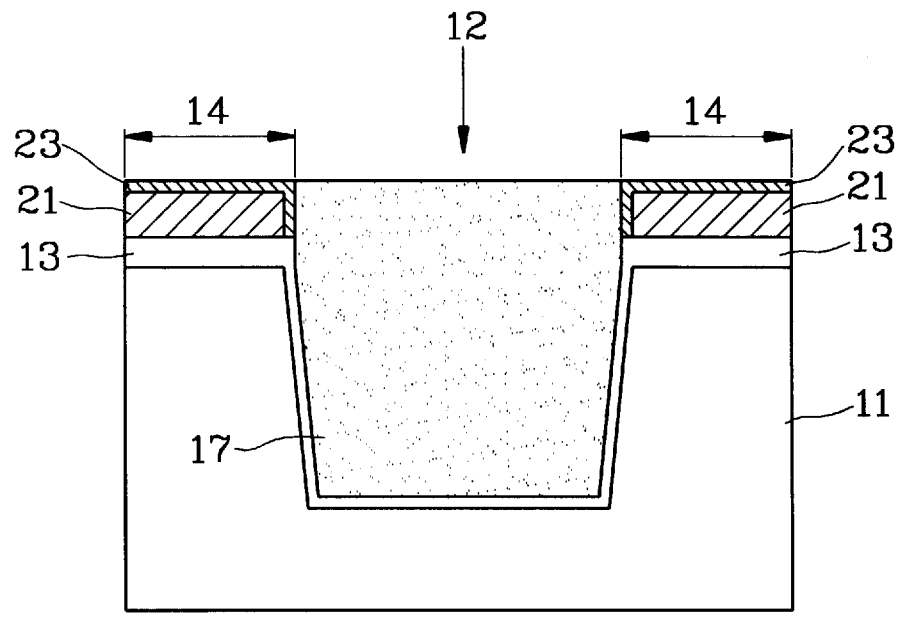
Figure 2:
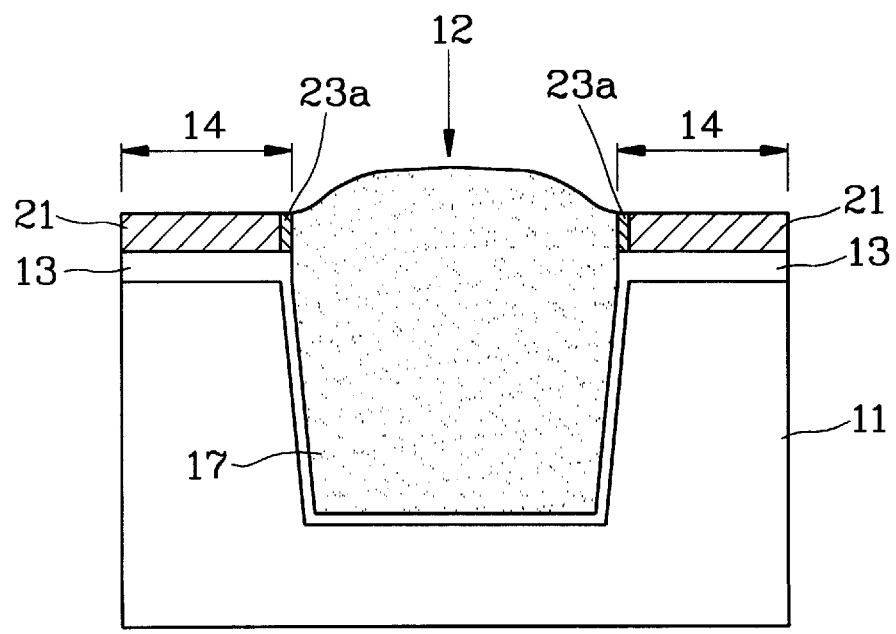
Figure 2:
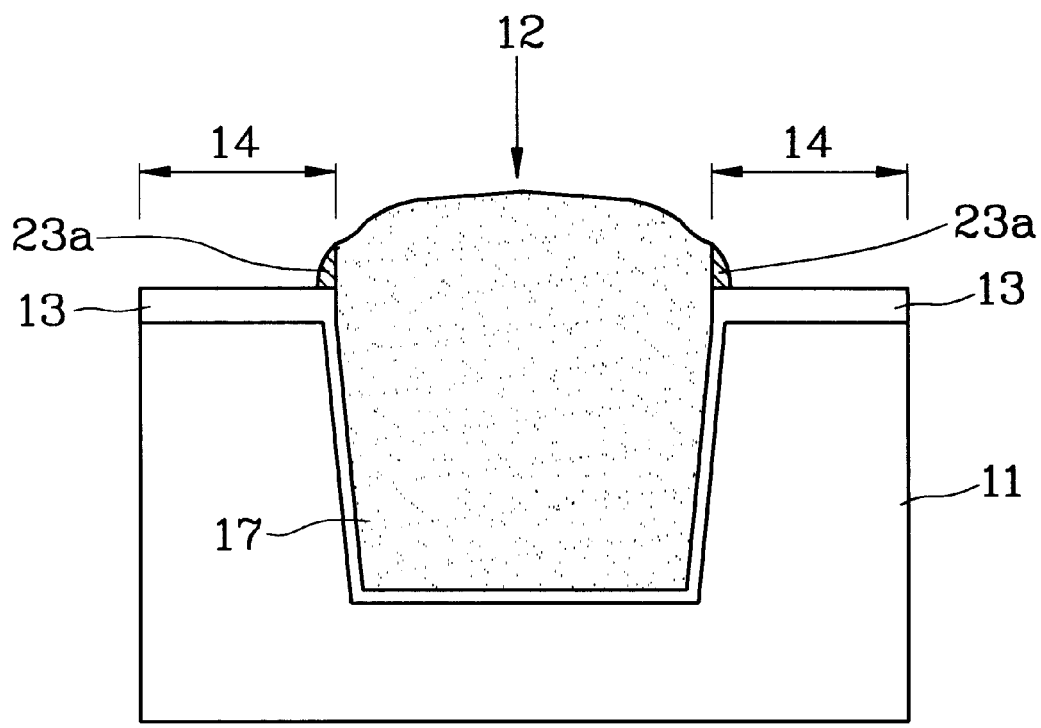

Referring now in detail to the drawings for the purpose of illustrating preferred embodiments of the present invention, the process for fabricating a shallow trench isolation as shown in FIGS. 2A to 2G comprise the following steps:

Referring now to FIG. 2, there are shown schematic process cross-sectional views of a silicon substrate 11 where the device is built. A pad oxide layer 13, and a polysilicon layer 21 are sequentially formed on the surface of the substrate 11 as shown in FIG. 2A. The polysilicon 21 is deposited to a preferred thickness of between about 1500 and 2500 Angstroms. Using the polysilicon layer 21 as a mask, the substrate 11 is patterned by the conventional photolithography. Active areas 14 and shallow trench regions 12, which separate active device regions as shown in FIG. 2B, are formed by etching technique.

A pad oxide layer 23 is formed on the top surface and sidewall of the polysilicon 21 by thermal oxidation as shown in FIG. 2C which is one of the points of the present invention. The thickness of the pad oxide 23 should be thick enough to avoid the Oxide-Recess 19a on the sidewall of shallow trench 12. Typically the pad oxide layer 23 is a thick polysilicon oxide layer with a thickness of between about 500 to 1000 Angstroms. Next, a dielectric layer 17 is formed to fill into the trenches 12 as shown in FIG. 2D. The dielectric layer 17 is usually formed by silicon oxide deposition according to plasma-enhanced chemical vapor deposition (PECVD) method. Thereafter, the dielectric layer 17 is etched back by chemical mechanical polishing (CMP) technique.

The following step is another key point of the present invention. First, C referring to FIG. 2E, the dielectric layer 17 overlying the active area 14 is etched back by conventional chemical mechanical polishing (CMP) technique. The surface of the dielectric layer 17 in shallow trench 12 is higher than the surface of the polysilicon layer 21 in active area 14. The polishing rate of the polysilicon layer 21 is faster than that of the dielectric layer 17 when the polysilicon layer 21 is the etching end point as shown in FIG. 2F. Finally, the sidewall spacers 23a are formed from the residual of pad oxide of the shallow trench 12 when removing the polysilicon 21 with the wet etching method as shown in FIG. 2G.

The key point of the present invention is replacing the silicon nitride with polysilicon, because the polysilicon is easily oxidized to form a passivation oxide. The pad oxide 23 is etched to form the sidewall spacers 23a. The sidewall spacers 23a are thick enough to avoid producing the Oxide-Recess 19a on the sidewall of shallow trench 12. The sidewall spacers 23a can protect the shallow trench from etching and provide a best isolation effect to avoid the kink effect in the follow-up process of oxidation and etching.

The invention being thus described, it will be obvious that the same may be varied in many ways. Such variations are not to be regarded as a departure from the spirit and scope of the invention, and all such modifications as would be obvious to one skilled in the art are intended to be included in the scope of the following claims.

What is claimed is:

1. A method of fabricating a shallow trench isolation of integrated circuits, comprising:
   (a) sequentially forming an oxide layer and a polysilicon layer on a silicon substrate;
   (b) forming a plurality of shallow trenches inside said silicon substrate;
   (c) forming an oxide passivation layer over said polysilicon layer;
   (d) depositing a dielectric layer to fill in said shallow trenches and over the oxide passivation layer;
   (e) etching back said dielectric layer and the oxide passivation layer to a topology where said dielectric layer above said shallow trenches is higher than the polysilicon layer;
   (f) forming passivation oxide spacers on a sidewall of said dielectric layer above said shallow trenches by removing the remaining polysilicon layer.

2. The method of claim 1, wherein said polysilicon layer has a thickness of between 1500 to 2500 Angstroms.

3. The method of claim 1, wherein said passivation oxide layer is formed by thermal oxidation.

4. The method of claim 1, wherein said passivation oxide layer has a thickness of between 500 to 1000 Angstroms.

5. The method of claim 1, wherein said dielectric layer is deposited by plasma enhance chemical vapor deposition (PECVD).

6. The method of claim 1, wherein etching back stops at the polysilicon layer.

7. A method of fabricating a shallow trench isolation of integrated circuits, comprising:
   (a) sequentially forming an oxide layer and a polysilicon layer on a silicon substrate;
   (b) forming a plurality of shallow trenches inside said silicon substrate;
   (c) forming an oxide passivation layer over said polysilicon layer;
   (d) depositing a dielectric layer to fill in said shallow trenches and over the oxide passivation layer;
   (e) etching back said dielectric layer and the oxide passivation layer by using chemical mechanical polishing (CMP); and
   (f) forming passivation oxide spacers on a sidewall of said dielectric layer above said shallow trenches by removing the remaining polysilicon layer.

8. The method of claim 7, wherein said polysilicon layer has a thickness of between 1500 to 2500 Angstroms.

9. The method of claim 7, wherein the area between said shallow trenches are active device regions.

10. The method of claim 7, wherein said passivation oxide layer is formed by thermal oxidation.

11. The method of claim 7, wherein said passivation oxide layer has a thickness of between 500 to 1000 Angstroms.

12. The method of claim 7, wherein said dielectric layer is deposited by plasma enhance chemical vapor deposition (PECVD).

13. The method of claim 7, wherein etching back stops at the polysilicon layer.

* * * * *